United States Patent
Cadee et al.

(10) Patent No.: US 8,810,777 B2
(45) Date of Patent: Aug. 19, 2014

(54) LITHOGRAPHIC APPARATUS, A METHOD FOR REMOVING MATERIAL OF ONE OR MORE PROTRUSIONS ON A SUPPORT SURFACE, AND AN ARTICLE SUPPORT SYSTEM

(75) Inventors: Theodorus Petrus Maria Cadee, Vlierden (NL); Noud Jan Gilissen, 's-Gravenzande (NL); Rene Theodorus Petrus Compen, Valkenswaard (NL); James Kennon, Benicia, CA (US)

(73) Assignee: ASML Netherlands B.V., Veldhoven (NL)

( * ) Notice: Subject to any disclaimer, the term of this patent is extended or adjusted under 35 U.S.C. 154(b) by 448 days.

(21) Appl. No.: 12/699,562

(22) Filed: Feb. 3, 2010

(65) Prior Publication Data
US 2010/0214549 A1  Aug. 26, 2010

Related U.S. Application Data

(60) Provisional application No. 61/155,034, filed on Feb. 24, 2009.

(51) Int. Cl.
| | | |
|---|---|---|
| *G03B 27/58* | (2006.01) | |
| *G03F 7/20* | (2006.01) | |
| *B24B 35/00* | (2006.01) | |
| *B24B 31/112* | (2006.01) | |

(52) U.S. Cl.
CPC ............ *B24B 31/112* (2013.01); *G03B 27/58* (2013.01); *G03F 7/707* (2013.01); *B24B 35/00* (2013.01); *G03F 7/70783* (2013.01)
USPC .............................................. 355/72; 355/53

(58) Field of Classification Search
CPC ... G03F 7/70783; G03F 7/707; B24B 31/112; B24B 35/00
USPC ............................... 355/53, 72, 75; 250/492.1
See application file for complete search history.

(56) References Cited

U.S. PATENT DOCUMENTS

| | | |
|---|---|---|
| 5,191,200 A | 3/1993 | Van Der Werf et al. |
| 5,951,369 A | 9/1999 | Kordonski et al. |

(Continued)

FOREIGN PATENT DOCUMENTS

| | | |
|---|---|---|
| JP | 01-035613 | 2/1989 |
| JP | 08-115868 | 5/1996 |

(Continued)

OTHER PUBLICATIONS

Japanese Office Action mailed Jan. 25, 2012 in corresponding Japanese Patent Application No. 2010-031894.

*Primary Examiner* — Peter B Kim
(74) *Attorney, Agent, or Firm* — Pillsbury Winthrop Shaw Pittman LLP

(57) ABSTRACT

A lithographic projection apparatus includes a beam production system to provide a beam of radiation, pattern the beam of radiation, and project the patterned beam onto a target portion of a substrate, a support table including protrusions to support an article, a detector to detect height deviations of the protrusions, a material removing device arranged to modify a height of the protrusion material, a controller coupled between the detector and the material removing device, wherein material removing device includes a removal tool selected from the group consisting of a mechanical polishing device, a magneto rheological finishing tool, and a single or multipoint diamond tool.

14 Claims, 4 Drawing Sheets

(56) References Cited

U.S. PATENT DOCUMENTS

| | | | |
|---|---|---|---|
| 6,392,738 B1 | 5/2002 | Van De Pasch et al. | |
| 7,078,715 B2 | 7/2006 | Vink et al. | |
| 2004/0241992 A1* | 12/2004 | Kono et al. | 438/689 |
| 2005/0061995 A1 | 3/2005 | Vink et al. | |

FOREIGN PATENT DOCUMENTS

| | | |
|---|---|---|
| JP | 2001-144013 | 5/2001 |
| JP | 2003-248112 | 9/2003 |
| JP | 2005-064514 | 3/2005 |
| JP | 2006-024954 | 1/2006 |
| JP | 2006-119624 | 5/2006 |

* cited by examiner

LITHOGRAPHIC APPARATUS, A METHOD FOR REMOVING MATERIAL OF ONE OR MORE PROTRUSIONS ON A SUPPORT SURFACE, AND AN ARTICLE SUPPORT SYSTEM

CROSS REFERENCE TO RELATED APPLICATIONS

This application claims priority and benefit under 35 U.S.C. §119(e) to U.S. Provisional Patent Application No. 61/155,034, entitled "Lithographic Apparatus, A Method For Removing Material Of One Or More Protrusions On A Support Surface, and An Article Support System", filed on Feb. 24, 2009. The content of that application is incorporated herein in its entirety by reference.

FIELD

The present invention relates to a lithographic apparatus, a method for removing material of one or more protrusions on a support surface, and an article support system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The substrate support tables used in lithography have a support surface with protrusions that extend substantially perpendicularly from the surface. In operation, the backside of the substrate is supported on the protrusions, at a small distance from the support surface of the substrate table, in a position substantially perpendicular to the direction of propagation of the projection beam. Thus, the tops of the protrusions, rather than the support surface of the wafer table, define an effective support surface for the substrate.

In order to avoid overlay errors during projection of patterned beam of radiation on a substrate, it is desirable that the substrate top surface be flat. Unevenness of the supporting surface of the substrate support may lead to an uneven top surface of the substrate supported on the support surface. Therefore, it is desirable to avoid unevenness in the substrate support.

Unevenness of the supporting surface can be caused by dissimilarity between the heights of material that makes up the protrusion itself. This is typically the case when a new substrate support table has been manufactured. Possibly uneven wear may also lead to unevenness. In a known embodiment, the substrate support table contains a chuck on which the table with the protrusions is supported. In an alternative embodiment the chuck and substrate support table may be integrated in a single unit. Unevenness may be the result of differences between the heights of the protrusions, or in the backside of the table or in the chuck. Therefore these elements are carefully made level. Nevertheless it has been found that unevenness may also result when the chuck and the support table (and any other elements) are assembled or installed. Similar problems may be encountered with support tables for other articles that have to be supported in a well-defined plane across the beam path, such as reflective patterning devices or transmission patterning devices US 2005/0061995 A1, the contents of which is herein incorporated by reference in its entirety, provides a lithographic projection apparatus including a detector to detect height deviations of the protrusions that affect a surface flatness of the article, a height adjustment device arranged to independently modify a height of the protrusion material of individual protrusions when the support table is operable in the apparatus, and a controller coupled between the detector and the height adjustment device and arranged to control the height adjustment device to adjust the height of the protrusions corresponding to the detected height deviations of the protrusions that affect the surface flatness of the article.

An in situ height adjustment device is used to alter the height of the material that at least the top of individual protrusions are integrally made of, when the support table is at an operable position in the lithographic projection apparatus. By "operable," it is meant that the support table may be moved to a pattern projection position in the apparatus from the operable position without movements that are more disruptive to the support table assembly than during normal use. "Integrally made" refers to material that is used to manufacture the support table or coatings or other material layers on the protrusions, but not to accidental foreign material such as pollution. By adjusting the height of the protrusions in the assembled support table in the lithographic apparatus, at such an operable position, a reliable local and global height adjustment may be realized.

A detector determines which of the protrusions have a height deviation and a control unit controls the height adjustment device, for example, to remove a part of the material of selected protrusions with excess height, but not from other protrusions that do not have an excess height, or an excess height below a threshold.

SUMMARY

It is desirable for cost of ownership, cost of goods and/or quality of overlay to provide an improved height adjustment device for in situ use in a lithographic apparatus, or at least an alternative therefor. Furthermore, it is desirable to provide a method for use of such improved or alternative height adjustment device.

According to an embodiment of the invention, there is provided a lithographic projection apparatus including: a beam production system configured to provide a beam of radiation, patterning the beam of radiation, and projecting the patterned beam onto a target portion of a substrate; a support table configured to support an article so that a surface of the article lies in a predetermined plane in relation to a propagation direction of the projection beam, the support table having a support surface and an array of protrusions extending from the support surface to support the article on the protrusions, at least a top of each protrusion being substantially formed of an integral protrusion material; a detector configured to detect height deviations of the protrusions that affect a surface flatness of an article supported on the support table; a material removing device arranged to modify a height of the protrusion material of one or more protrusions when the support table is operable in the apparatus; and a controller coupled between the detector and the material removing device and arranged to control the material removing device to adjust the height of the protrusions corresponding to the detected height deviations of the protrusions that affect the surface flatness of the article, wherein the material removing device includes a removal tool selected from the group consisting of a mechanical polishing device, a magneto rheological finishing tool, and a single or multipoint diamond tool.

According to an embodiment of the invention, there is provided a method for removing material of one or more protrusions on a support surface of a support table for holding an article with a surface in a predetermined plane in relation to a projection path in a lithographic projection apparatus, the support table including a support surface with an array of protrusions, each of which includes a top that is integrally made of protrusion material, the protrusions extending from the support surface for supporting the article, the method including: measuring height deviations of the protrusions that affect a surface flatness of the planar surface of the article when the surface element is mounted on the support table; and adjusting a height of the protrusion material by removing material of one or more protrusions corresponding to the detected height deviations of the protrusions, wherein the measuring and the adjusting are executed while the support table is in an operable position in the lithographic projection apparatus, and wherein the removing is carried out by using a removal tool selected from the group consisting of a mechanical polishing device, a magneto rheological finishing tool, and a single or multipoint diamond tool.

According to an embodiment of the invention, there is provided an article support system for use in a lithographic apparatus, the support system including: a support table configured to support an article so that a surface of the article lies in a predetermined plane in relation to a propagation direction of the projection beam, the support table having a support surface and an array of protrusions extending from the support surface to support the article on the protrusions, at least a top of each protrusion being substantially formed of an integral protrusion material; a detector configured to detect height deviations of the protrusions that affect a surface flatness of an article supported on the support table; a material removing device arranged to modify a height of the protrusion material of one or more protrusions when the support table is operable in the apparatus; a controller coupled between the detector and the height adjustment device and arranged to control the height adjustment device to adjust the height of the protrusions corresponding to the detected height deviations of the protrusions that affect the surface flatness of the article, wherein the material removing device includes a removal tool selected from the group consisting of a mechanical polishing device, a magneto rheological finishing tool, and a single or multipoint diamond tool.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
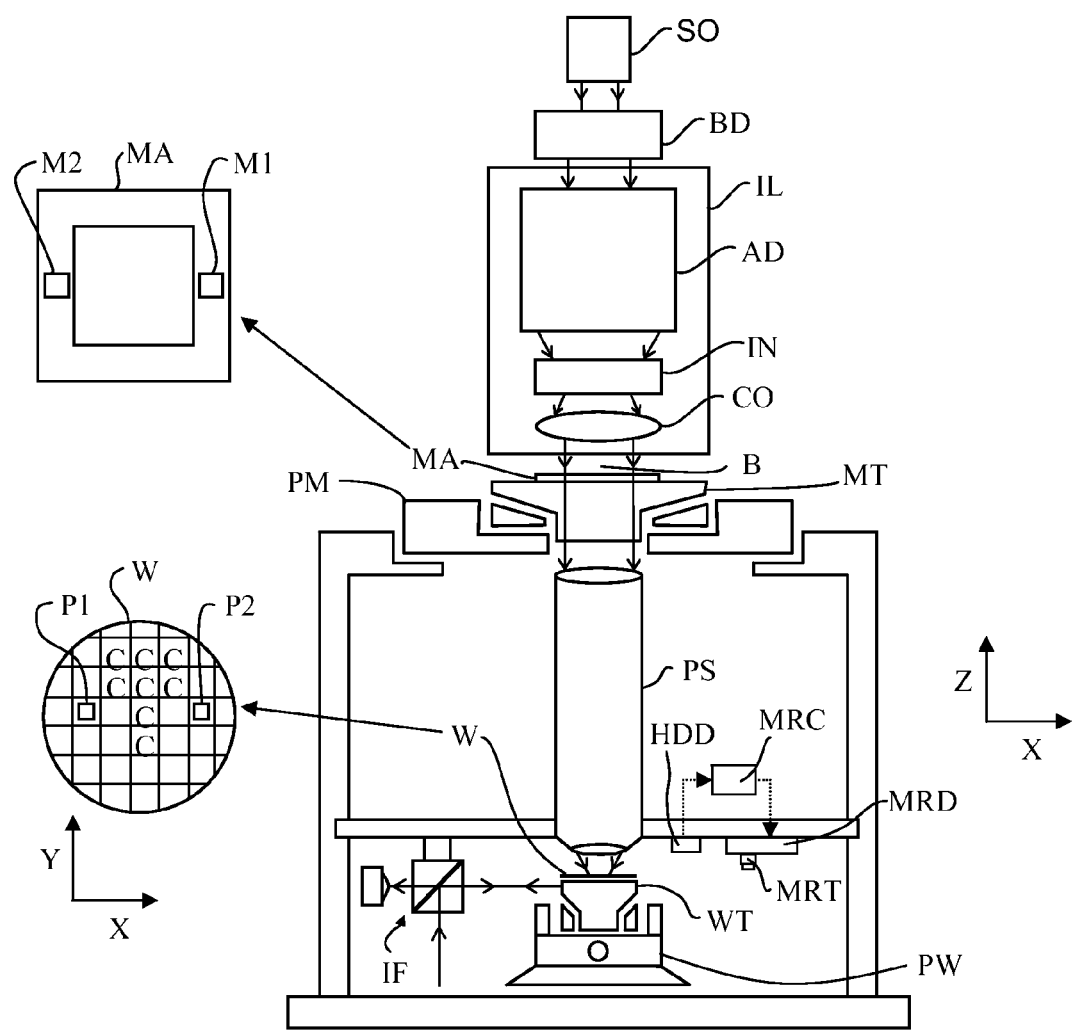
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the mask support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus of FIG. 1 includes an in situ material removing device MRD configured to remove material from one or more protrusions of the substrate table WT of the lithographic apparatus. This material removal device MRD is configured to provide material from one or more protrusions in order to obtain a more even support for a substrate supported on the substrate table WT. The material removal device MRD is located at a substantially stationary location and includes a removal tool MRT which is to be brought into contact with the one or more protrusions to remove materials of the one or more protrusions.

The lithographic apparatus further includes a detector HDD configured to detect height deviations of the protrusions that affect a surface flatness of an article supported on the support table. The detector HDD may for instance be a level sensor configured to measure the upper surface of a substrate supported on the water table WT. Such level sensor is for instance disclosed in U.S. Pat. No. 5,191,200, the contents of which is herein incorporated in its entirety. The detector HDD may be used to measure the top surface of multiple substrates to determine which errors in the surface are caused by the substrate itself, and which are caused by the substrate support, i.e. the protrusions.

The detector HDD is connected to a controller MRC coupled between the detector HDD and the material removal device MRD. The controller is configured to control the material removal device MRD to adjust the height of the protrusions corresponding to the detected height deviations of the protrusions that affect the surface flatness of the article. The controller MRD may be a separate controller specially adapted for creating a flat surface by, when required removing material of the protrusions of the substrate table WT, or it may be integrated in a controller configured to perform multiple control tasks in the lithographic apparatus.

Further details on the general operation of the material removing device MRD is disclosed in US 2005/0061995 A1, the contents of which is herein incorporated by reference in its entirety.

Generally, the removal of material from one or more protrusions may be carried out by a relative movement between the removal tool MRT and the one or more protrusions. This relative movement may be performed by translating the one ore more protrusions with respect to the material removal tool MRT and/or translating the material removal tool MRT with respect to the one or more protrusions. The removal material tool MRT may be rotated to enhance the removal of material of the protrusions.

According to an embodiment of the invention, the removal tool MRT may include a polishing device, a magneto rheological finishing tool, or a single or multipoint diamond tool. Examples of each of these embodiments will be discussed hereinafter in more detail.

Figure 2:
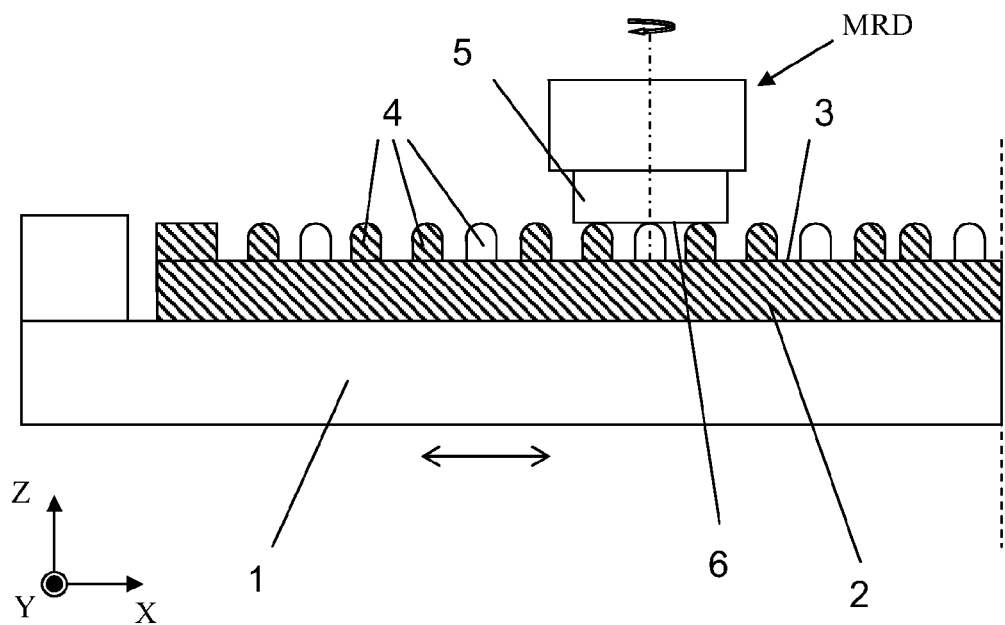
FIG. 2 depicts a material removing device according to an embodiment of the invention.

FIG. 2 discloses a material removing device according to an embodiment of the invention. FIG. 2 shows a chuck 1 of a lithographic apparatus. The chuck 1 is part of a substrate support configured to support a substrate during projection of an image on the substrate.

On the chuck 1 a support table 2 is provided. The support table 2 is configured such that a surface of the substrate supported on the support table lies in a predetermined plane in relation to a propagation direction of the projection beam. The surface supported on the support table is a planar surface, which may be curved or flat. The surface is preferably oriented transverse to the propagation direction of the projection beam. The support table 2 has a support surface 3 and an array of protrusions 4 extending from the support surface 3 to support the substrate on the protrusions 4. The configuration of the array of protrusions 4 is designed to obtain an optimal support for a substrate supported thereon. The support table 2 is shown in cross-section, whereby some protrusions lie in the plane of the cross section and some protrusions lie behind this plane.

The support table 2 may for instance be held on the chuck using a vacuum system (not shown).

The material removing device MRD includes as a material removal tool a polishing stone 5 of ceramic material including a polishing surface 6. The polishing surface 6 is a circular plane having a diameter of 20 mm or smaller. The polishing surface 6 has a surface flatness of smaller than 0.005 mm, preferably smaller than 0.001 mm. The roughness of the polishing surface is preferably larger than 0.4 μm Ra, more preferably larger than 0.8 μm Ra, more preferably larger than 1 μm Ra. The polishing stone 5 or at least the polishing surface 6 may preferably include Silicon Carbide (SiC) and/or Aluminum Oxide ($Al_2O_3$). The hardness of the polishing stone may be in the range of 1000 to 3000 kg/mm².

The polishing surface 6 has been configured to remove 1 nm to 100 nm of the one or more protrusions 4 by 1 to 250, preferably 50 to 150 passes, of the polishing surface 6 over the one or more protrusions 4. In a preferred embodiment, 1 to 250 passes are required for removal of each 1 nm.

During use the polishing surface 6 rests on the tops of three protrusions 4. The polishing stone 5 is held in a fixed position but is free to rotate about the x-axis (Rx) and the y-axis (Ry) to adapt the rotary position of the polishing stone 5 to the tops of the respective three protrusions. In alternative embodiments, the polishing stone 5 may be fixed in Rx and Ry, or may be positionable in a desired rotary position to remove material from the one or more protrusions in accordance with that rotary position. In alternative embodiments the polishing stone may rest on the tops of more than three protrusions 4.

In the embodiment shown in FIG. 2, the chuck 1 is moved along the polishing stone 5 in order to remove material from the tops of the three protrusions on which the polishing surface rests. To improve the removal of material, the polishing stone is rotated about an axis parallel to the z-direction. However, this may not be required to obtain the desired removal of material.

In alternative embodiment, the material removal device MRD may be configured to move the polishing stone 5 over the protrusions 4, while the chuck 1 is not moved, or the chuck 1 and the polishing stone 5 may be simultaneously moved.

The pressure in the z-direction between the polishing surface 6 and the one or more protrusions, required to obtain the abrasive effect, may be exerted by the chuck 1 or the material removal device MRD or by both.

Figure 3:
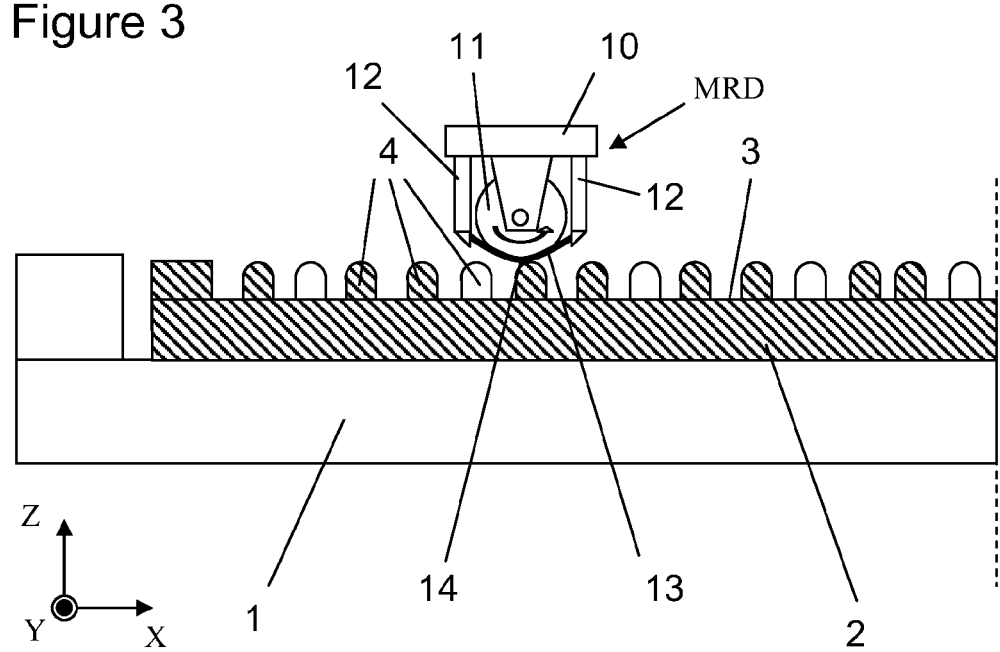
FIG. 3 depicts a material removing device according to an embodiment of the invention.

FIG. 3 shows a material removal device MRD for removing material from one or more protrusions 4 according to an embodiment of the invention. The material removing device MRD includes a magneto rheological finishing tool 10. The magneto rheological finishing tool 10 includes a carrier wheel 11, and fluid supply 12 to provide a magneto rheological fluid (MR-fluid) 13 on the wheel 11, when it is rotated. The magneto rheological finishing tool 10 includes a magnetic field generator configured to create a magnetic field to stiffen the MR-fluid 13 on the carrier wheel 11 in order to use this MR-fluid 13 to remove material from one or more protrusions 4.

A general construction of a magneto rheological finishing tool is for instance described in U.S. Pat. No. 5,951,369, the contents of which is herein incorporated by reference in its entirety.

The magneto rheological finishing tool 10 is positioned at a stationary location. By movement of the substrate table 2 with respect to the magneto rheological finishing tool 10, the protrusions may be moved along the contact surface 14 on the band of MR-fluid. The protrusions 4 will be typically translated with respect to the contact surface 14. Any other suitable movement may also be made.

The width of the band of MR-fluid 13 and the diameter of the carrier wheel 13 are chosen such that only one protrusion can be contacted by the MR-fluid 13 during removal of material of that protrusion. In the present embodiment, the width of the band of MR-fluid 13 on the carrier wheel 11 is smaller than 10 mm, preferably smaller than 5 mm, for instance 4 mm. The contact surface 14 in the longitudinal direction of the band is preferably also smaller than 10 mm, more preferably smaller than 5 mm, for instance 4 mm In another embodiment, the tool 10 may be configured to simultaneously contact multiple protrusions 4.

In the embodiment of FIG. 3, the carrier wheel 11 rotates about an axis substantially parallel to the support surface 3 of the substrate table 2. In an alternative embodiment, the carrier wheel 11 may be configured to rotate about an axis substantially perpendicular with the support surface 3, i.e. parallel to the z-direction.

Figure 4:
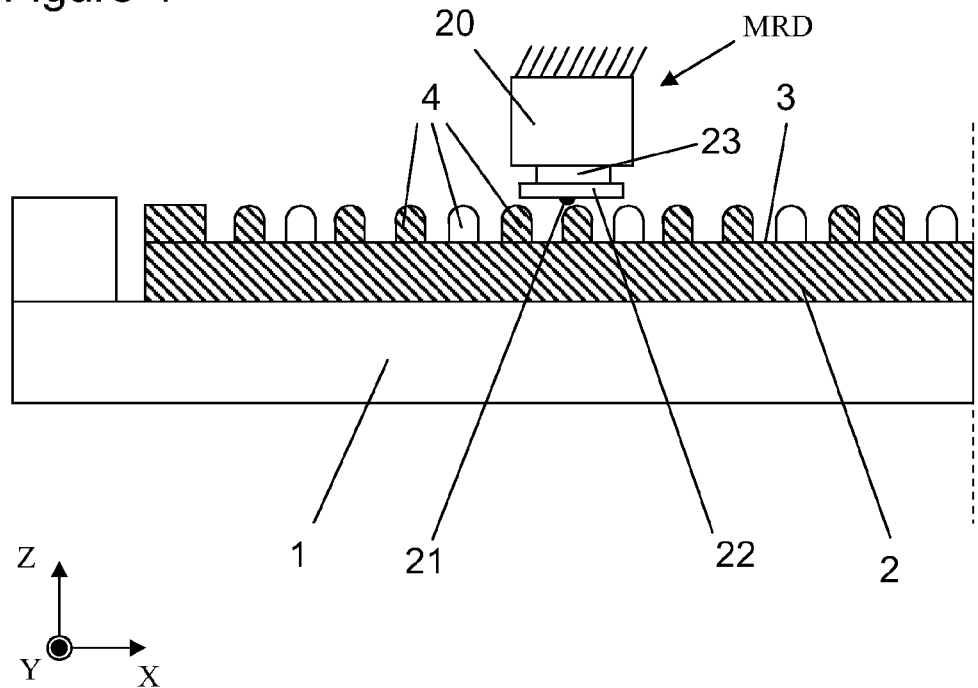
FIG. 4 depicts a material removing device according to an embodiment of the invention.

FIG. 4 shows a material removal device MRD with an alternative embodiment of a magneto rheological finishing tool 20. In this magneto rheological finishing tool 20 a relative small amount of MR-fluid 21 is used. This small amount of MR-fluid 21 is held as a droplet at the underside of a plate shaped object 22. At the opposite side of the plate shaped object 22, a magnetic field generator 23 is provided to create a magnetic field which holds the droplet of MR-fluid 21 against the plate shaped object 22. The device 23 may be configured to hold the droplet of MR-fluid 21 at a substantially stationary location, or the device 23 may move the droplet of MR-fluid 21 over a path along the plate-shaped object 22. The device 23 may also be located at any other suitable location to create the desired magnetic field.

Material may be removed from one or more protrusions by moving the respective protrusions over the droplet of MR-fluid 21.

The small amount of MR-fluid is smaller than 250 mm$^3$, preferably smaller than 100 mm$^3$, for instance 50 mm$^3$, or even smaller than 50 mm$^3$.

Figure 5:
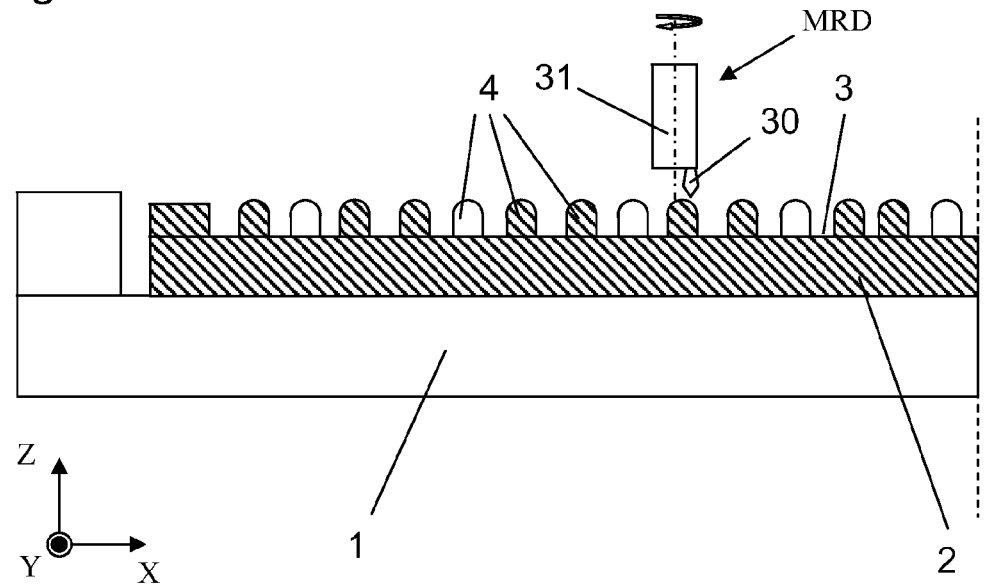
FIG. 5 depicts a material removing device according to an embodiment of the invention.

FIG. 5 shows a material removal device MRD according to an embodiment of the invention. The material removal device MRD is in the form of a single point diamond tool having a diamond 30. The diamond 30 is mounted on a rotatable spindle 31 which is rotatable about an axis parallel to the z-direction, i.e. perpendicular to the support surface 3. The diamond 30 is mounted with an offset with respect to the axis of rotation.

The diamond tool 30 is rotated with high speed, preferably faster than 50000 rotations per minute, more preferably more than 100000 rotations per minute. While rotating, the diamond tool is moved over a protrusion of which material is to be removed. After a pass over the protrusion, the diamond tool, when desired may be fed towards the support surface 2 for removal of another layer of the protrusions, until the desired height of the protrusions is obtained.

Figure 6:
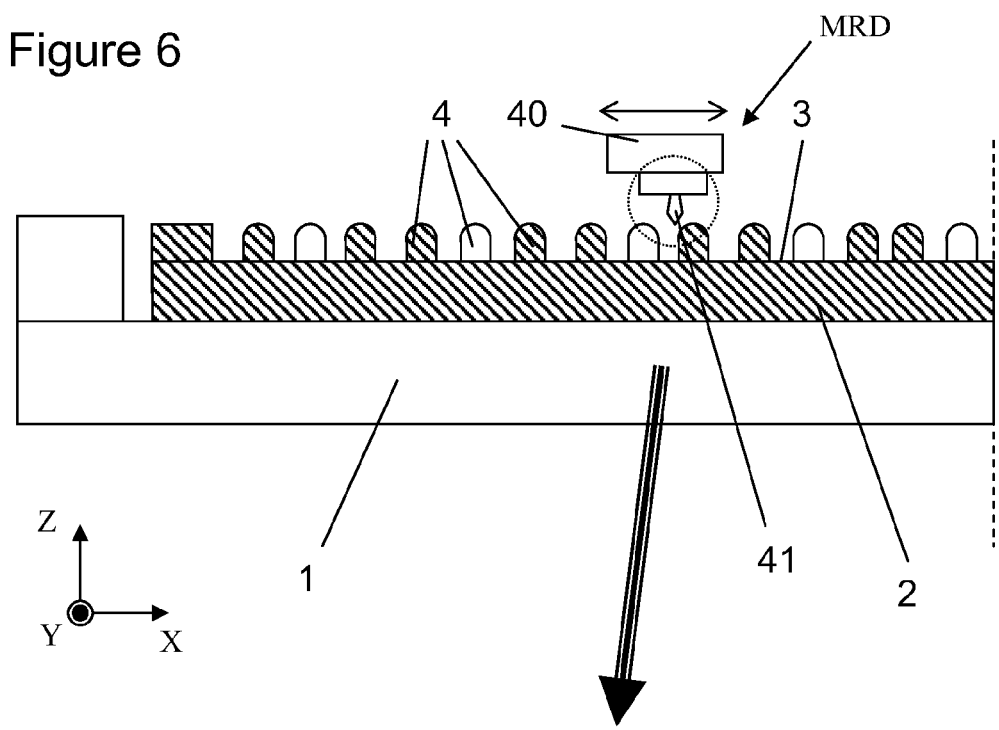
FIG. 6 depicts a material removing device according to an embodiment of the invention.
Figure 7:
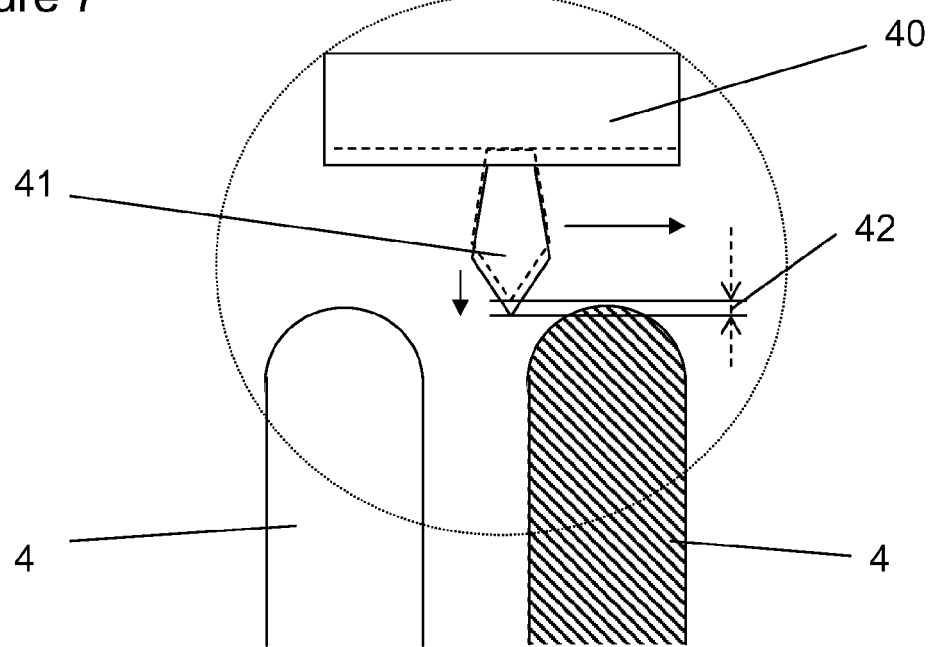
FIG. 7 depicts a detail of the embodiment of FIG. 6.

In an alternative embodiment, the diamond tool 30 may be a multi-point diamond tool FIGS. 6 and 7 show a material removal device according to an embodiment of the invention, including a diamond tool 40 having a single point diamond 41. The diamond tool 40 is non-rotatable, but movable in at least one direction parallel to the support surface 2 as indicated by the double headed arrow.

To remove material from a protrusion, the diamond tool 40 is for instance moved in the x-direction over the protrusion 4, while the diamond 41 cuts in the protrusion 4. This movement in the x-direction is repeated for a number of y-positions to cover the whole surface of the protrusion 4. The movement in the y-direction may be carried out by the chuck 1 and/or the diamond tool 40. After these passes, the diamond tool may be fed with a feed distance 42 towards the support surface 2 to cut, when desired, another layer from the protrusion.

The feed 42 with which the diamond tool is moved towards the respective protrusion is small, preferably smaller than 100 nm, more preferably smaller than 50 nm, even more preferably smaller than 20 nm. This feed 42 is schematically indicated in FIG. 7. In reality, the feed will be smaller compared with the size of the protrusions than shown in FIG. 7.

A similar movement with a feed of smaller than 100 nm, preferably smaller than 50 nm, even more preferably smaller than 20 nm, may be used in any of the other embodiments shown in FIGS. 2 to 5.

In an alternative embodiment, the diamond tool 40 may include a multi-point diamond.

The provision of the material removing device according to an embodiment of the invention in a lithographic apparatus offers a number of benefits over prior art lithographic apparatus. A first benefit is that the substrate table can be installed in a lithographic apparatus with a smaller flatness and thus at a lower cost, as the substrate table can be flattened in the lithographic apparatus by using the material removing device. Further, wear of the table is no longer of great importance as the unflatness due to wear may be corrected. As a result, less stringent restrictions on the wafer table material may be used. Moreover, by using the material removal device, the flatness of the substrate support surface may be improved in the course of time therewith improving the overlay performance of the lithographic apparatus.

Hereinabove the use of a material removal device is described for the removal of material of one or more protrusions of a substrate support to provide a more even support for a substrate support thereon. A similar material removal device may also be used for other article support systems, such as a patterning device support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a projection system configured to project a patterned beam of radiation onto a target portion of a substrate;
    a support table having an array of a plurality of protrusions that is configured to support an article;
    a detector configured to detect a height deviation of one or more of the protrusions that affect a surface flatness of the article supported on the support table; and
    a material removing device having a removal tool that is configured to modify a height of a protrusion material of the one or more protrusions corresponding to the detected height deviation of the protrusions,
    wherein the removal tool comprises a plate shaped object, a magneto rheological fluid held as a droplet at an underside of the plate shaped object, and a magnetic field generator to create a magnetic field which moves the droplet over a path along the plate shaped object.

2. The lithographic apparatus of claim 1, wherein the droplet is less than 250 mm$^3$.

3. The lithographic apparatus of claim 2, wherein the droplet is less than 50 mm$^3$.

4. The lithographic apparatus of claim 1, wherein 1 nm to 100 nm of the one or more protrusions are removed by 1 to 250 passes of the removal tool over the one or more protrusions.

5. The lithographic apparatus of claim 1, wherein the removal tool has dimensions smaller than 5 mm.

6. The lithographic apparatus of claim 1, wherein in order to remove material of the one or more protrusions, the removal tool is held at a substantially stationary position.

7. The lithographic apparatus of claim 1, wherein the removal tool is movable with respect to the one or more protrusions in order to remove material for the one or more protrusions.

8. The lithographic apparatus of claim 1, wherein the article is a substrate.

9. The lithographic apparatus of claim 1, wherein the article is a patterning device.

10. The lithographic apparatus of claim 1, further comprising a controller coupled between the detector and the material removing device, wherein the controller is configured to control the material removing device to adjust a height of the one or more protrusions corresponding to the detected height deviation of the one or more protrusions.

11. A method of adjusting a height of a plurality of protrusions that supports an article in a lithographic apparatus that comprises a support table having an array of the protrusions, the method comprising:
    measuring a height deviation of one or more of the protrusions that affect a surface flatness of the article supported on the support table; and
    adjusting a height of a protrusion material of the protrusions by removing material of the one or more protrusions with a removal tool corresponding to the detected height deviation of the one or more protrusions,
    wherein the measuring and the adjusting are executed while the support table is in an operable position in the lithographic projection apparatus, and wherein the removal tool comprises a plate shaped object, a magneto rheological fluid held as a droplet at an underside of the plate shaped object, and a magnetic field generator that creates a magnetic field to move the droplet over a path along the plate shaped object.

12. The method of claim 11, wherein the droplet is less than 250 mm$^3$.

13. The method of claim 12, wherein the droplet is less than 50 mm$^3$.

14. The method of claim 11, wherein the measuring comprises
    placing an article on the support table supported by the plurality of protrusions;
    measuring a height profile of the planar surface of the article on a side facing away from the plurality of protrusions; and
    computing the height deviations of the plurality of protrusions from the height profile.

* * * * *